United States Patent [19]
Le Tron et al.

[11] 4,270,097
[45] May 26, 1981

[54] OSCILLATOR ELECTRONICALLY TUNABLE WITHIN A VERY WIDE FREQUENCY BAND

[75] Inventors: Yves Le Tron; Juan Obregon; Pierre-Georges Marechal; Serge Barvet, all of Paris, France

[73] Assignee: Thomson-CSF, Paris, France

[21] Appl. No.: 17,970

[22] Filed: Mar. 6, 1979

[30] Foreign Application Priority Data

Mar. 3, 1978 [FR] France .................. 78 06431

[51] Int. Cl.³ .............................................. H03B 5/18
[52] U.S. Cl. .................. 331/96; 331/117 FE; 331/117 D; 331/177 R
[58] Field of Search ............. 331/96, 117 R, 117 FE, 331/117 D, 177 R, 177 V, 181

[56] References Cited

U.S. PATENT DOCUMENTS

| 3,204,199 | 8/1965 | Lance | 331/117 D |
| 3,339,152 | 8/1967 | Will | 331/96 |
| 3,879,677 | 4/1975 | Arnold | 331/117 R X |
| 4,047,126 | 9/1977 | Anderson | 331/117 D X |

FOREIGN PATENT DOCUMENTS

| 2003205 | 11/1969 | France . |
| 1043900 | 9/1966 | United Kingdom . |
| 1076924 | 12/1966 | United Kingdom . |
| 1051015 | 7/1967 | United Kingdom . |
| 1121439 | 7/1968 | United Kingdom . |
| 1212763 | 11/1970 | United Kingdom . |
| 1295648 | 11/1972 | United Kingdom . |
| 1341867 | 12/1973 | United Kingdom . |
| 1352090 | 5/1974 | United Kingdom . |
| 1356481 | 6/1974 | United Kingdom . |
| 1362100 | 7/1974 | United Kingdom . |
| 1477249 | 6/1977 | United Kingdom . |

Primary Examiner—Siegfried H. Grimm
Attorney, Agent, or Firm—Oblon, Fisher, Spivak, McClelland & Maier

[57] ABSTRACT

An oscillator of the "three-terminal" type, comprising for example a field effect transistor, having a narrow spectrum and electronically tunable within a very wide frequency band in spite of its narrow spectrum due to a resonator of the yttrium garnet ball type. The field effect transistor has its source connected to a dipole comprising an electronically variable reactance and its gate connected to a similar dipole. A feedback loop is also established between input and output circuits of the oscillator. Under the action of a single command, acting for example on a magnetic field, the reactances vary simultaneously. In one embodiment, a single yttrium garnet ball resonator has two conductive half loops inserted in the tuning dipole and coupling dipole of the oscillator.

5 Claims, 5 Drawing Figures

OSCILLATOR ELECTRONICALLY TUNABLE WITHIN A VERY WIDE FREQUENCY BAND

The invention relates to electronic oscillators having a narrow spectrum, adapted to operate at very high frequency and electronically tunable within a very wide frequency band. It concerns an oscillator whose structure may comprise the following parts:
an active circuit comprising an active component of the three terminal or pole type such as a transistor, for example a field effect transistor;
a tuning dipole placed in an "input" channel of the active circuit proper;
a load bipole connected in an "output" channel of the active circuit;
a coupling dipole closing a feedback loop of the active circuit.

To produce an electronically tunable oscillator having a narrow spectrum, there is employed a tuning dipole provided, either with a diode having a capacity which is variable under the effect of a voltage applied across its terminals, or with a sphere of monocrystalline ferrimagnetic material, for example yttrium garnet, placed at the centre of a conductive loop within an adjustable continuous magnetic field.

The frequency band within which the spectrum line produced by the oscillator may be varied is often less wide than the interval of an octave taken as a term of reference. In particular, at very high frequency, there are for example obtained frequency excursions of from 7 to 10 GHz and from 10 to 13 GHz.

The invention aims at widening very substantially the frequency excursion of such oscillators.

According to the invention, there is provided an electronic oscillator of the type comprising a three terminal active component to which are connected, by their first terminals, a tuning dipole, a load dipole and a feed back loop comprising a coupling dipole, the second terminals of these dipoles being common, wherein the tuning dipole and the coupling dipole comprise reactors which are simultaneously adaptable by electronic means.

A better understanding of the invention will be had and other features will be apparent, from the ensuing description and the accompanying drawings in which.

Figure 1:
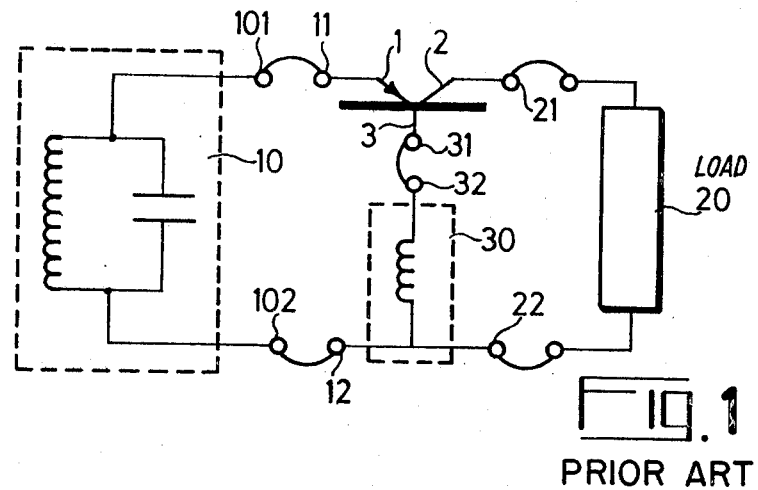
FIGS. 1 and 2 are simplified schematics of oscillators of a known type.

An oscillator (FIG. 1) comprises, for example, a transistor, in a circuit of the "common base" type whose emitter 1, collector 2 and base 3 are respectively connected to terminals 11, 21 and 31. These three terminals are respectively part of:
an input channel with a tuning dipole 10 (resonant circuit);
an output channel with a load dipole 20 (impedance of utilization);
a feedback loop between the output and the input where there is a dipole 30 (inductance) having one end 32 connected to the terminal 31 and the other end divided into two equipotential terminals 12 and 22, each connected to an available terminal of the dipoles 10 and 20.

The supply circuit for the transistor T, which is polarized in the conventional manner, has not been shown.

Figure 2:
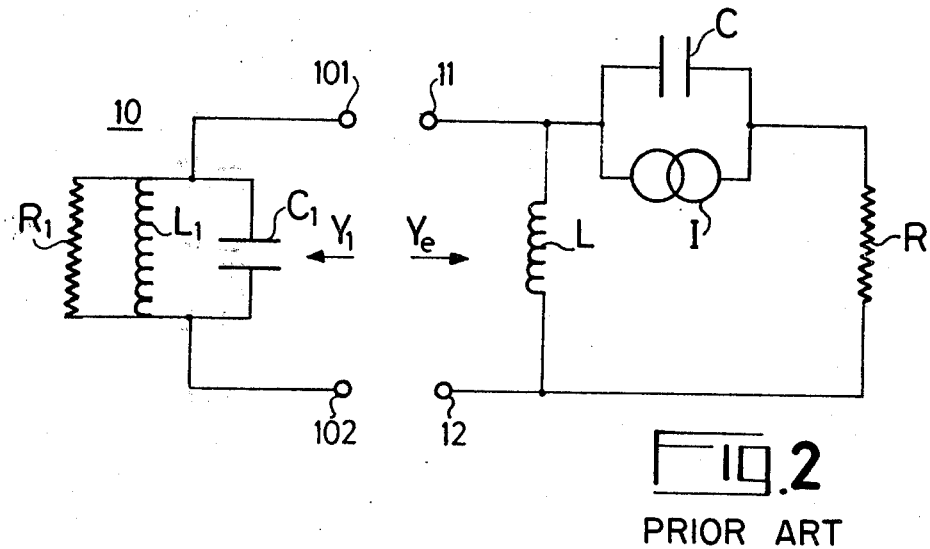

It is known that there exists in high frequency an approximate equivalent schematic such as that shown in FIG. 2 whereby it is possible to effect a simplified study of the oscillator of FIG. 1. Connected in parallel to the terminals 11 and 12 is a pure inductor L and, in series with the load dipole (pure resistor R for simplification), a source of current I shunted in high frequency by a capacitor C. Connected in parallel to the terminals 101 and 102 of the dipole 10 are an inductor $L_1$, a capacitor $C_1$ and a pure resistor $R_1$ of high value corresponding to a low leakage conductance $G_1$ ($G_1 = 1/R_1$).

If the admittance of the tuning dipole is termed $Y_1$ and that of the dipole appearing at the terminals 11 and 12 $Y_e$, there may be written by definition:

$$Y_1 = G_1 + j B_1$$

$$Y_e = G_e + j B_e$$

Simple calculations show that we have in the case of FIG. 2 for a bipole 100 having a coefficient $\alpha$ equal to 1:

$$G_1 = 1/R_1$$

$$G_e = \frac{1}{R}\left(1 - \frac{\omega_c^2}{\omega^2}\right)$$

$$\text{if } \omega^2 = \frac{1}{LC}$$

$\omega$ being the oscillation pulsation taken as a basis of the calculation;

$$B_1 = C_1\omega - \frac{1}{L_1\omega}$$

$$B_2 = \frac{-1}{L\omega}$$

The conditions of maintenance of the oscillations at the pulsation are as is well known:

$$\frac{1}{G_1} + \frac{1}{G_e} < 0 \quad (1)$$

$$B_1(\omega) + B_e(\omega) = 0 \quad (2)$$

Condition (1) signifies that there is a negative resistance and consequently that $G_e$ is negative, which presupposes that the pulsation $\omega$ is smaller than the pulsation $\omega_c$.

Condition (2) signifies that the susceptances $B_1$ and $B_e$ are of opposite sign and of the same absolute value.

Figure 3:
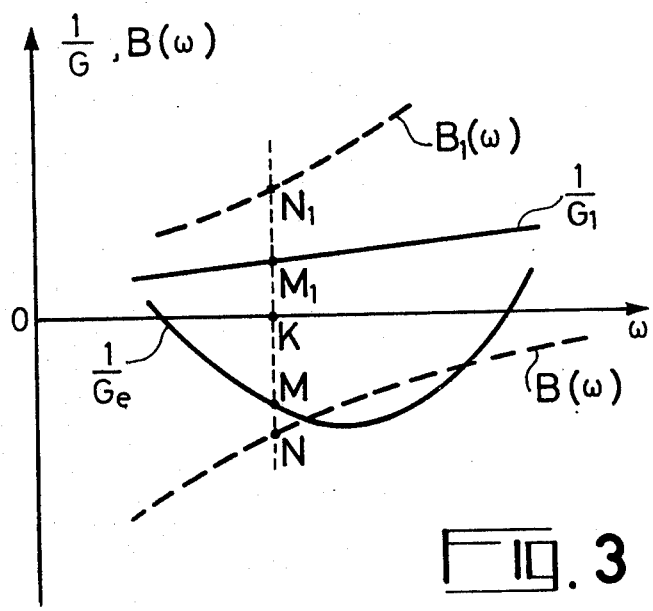
FIG. 3 is an explanatory diagram.

In FIG. 3 there have been shown as a function of the pulsation, plotted as abscissae, the magnitudes $1/G$ and $B(\omega)$, plotted as ordinates and relative, on one hand, to the dipole 10 ($1/G_1$, $B_1$) and, on the other to the active circuit ($1/G_e$, $B_e$).

It can be seen on this graph, that, for a value of the pulsation corresponding to an abscissa OK, the ordinates satisfy the relations (1) and (2), namely, when considering the algebraic values of the segments:

$$\overline{KM_1} + \overline{KM} < 0 \quad (3)$$

$$\overline{KN_1} + \overline{KN} < 0 \quad (4)$$

In the prior art, the tuning of such an oscillator may be electronically initiated by using, for example, as capacity $C_1$ a diode having a variable capacity provided with a control of the polarization applied to its terminals. But the frequency excursion is then limited by the necessity to satisfy both conditions (3) and (4).

In the case of the invention there are, on the contrary, varied simultaneously an element of the dipole 10, for example $C_1$ and an element of the active circuit, namely the inductor L, which may be represented by a displacement of the curve of FIG. 3 by the magnitude $1/G_e$. Consequently, the total frequency excursion is made possible within much wider limits than if solely the tuning dipole were varied.

In a first embodiment of the invention employing a field effect transistor, there are disposed yttrium garnet resonators respectively in the tuning dipole and in the coupling dipole, these two resonators being subjected to a common magnetic field H which is adjustable as desired.

Figure 4:
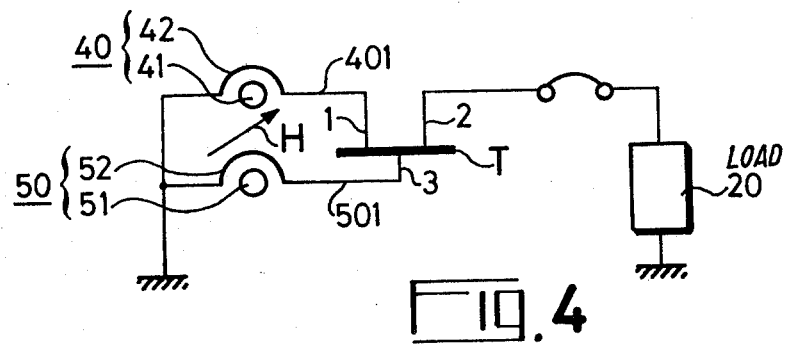
FIGS. 4 and 5 are schematics of embodiments according to the invention.

FIG. 4 shows schematically the electric high-frequency circuit of this embodiment, in omitting the polarization by a source of direct current voltage on the drain of the field effect transistor. Adjacent the source 1 of this transistor T, there is a yttrium garnet ball resonator 41 the conductive loop 42 of which is connected to the source 1 by a connection 401 and to earth by a connection which is as short as possible. The length of the connection 401 may be used to increase or decrease the reactance of the resonator at a given frequency. Another yttrium garnet ball resonator 51 has its loop 52 connected by a connection 51, whose length is also adjustable, to the control electrode 3 of the transistor. The latter is loaded between its drain 2 and earth by an impedance 20 which is preferably a pure resistance.

By way of example, an oscillator employing a field effect transistor, a yttrium garnet tuning dipole and a coupling inductor of $1.10^{-9}$ Henry had, before application of the invention, a frequency excursion of from 7 to 11 GHz. After the construction of the circuit of FIG. 4 with an yttrium garnet resonator 50 identical to the first-mentioned resonator, the frequency excursion extended to from 7 to 14 GHz. Much greater frequency excursions may be obtained up to several octaves by choosing different resonators and, in the case of yttrium garnet resonators, by adjusting the lengths of the connections 401 and 501.

There may also be employed in the tuning dipole and the coupling dipole a variable capacitance diode which may possibly be combined with ferrite resonators.

Figure 5:
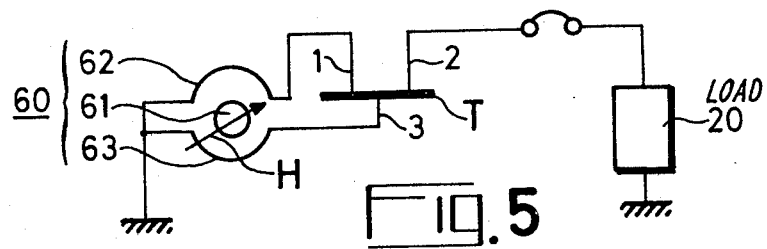

In a second embodiment of the invention (FIG. 5) there is a single yttrium garnet ball resonator 61 having two conductive half loops 62 and 63 inserted in the tuning dipole and coupling dipole in a manner similar to that of the circuit of FIG. 4. The results are comparable to those of the first embodiment while the overall size is reduced.

What we claim is:
1. An electronic oscillator of the type comprising:
   a three terminal active component to which are connected, by their first terminals a tuning dipole, a load dipole and a feedback loop comprising a coupling dipole, the second terminals of these dipoles being common, wherein the tuning dipole and the coupling dipole comprise reactors which are simultaneously variable by electronic means;
   said variable reactors comprising resonators having a common sphere of monocrystalline magnetic material such that the reactance of said resonators is correspondingly varied by a common magnetic field.
2. An oscillator as claimed in claim 1, wherein the active component is a bipole transistor.
3. An oscillator as claimed in claim 1, wherein the magnetic material is yttrium garnet.
4. An oscillator as claimed in claim 1, wherein for adjusting the reactance of at least one resonator, the length of the connecting wire acting as an inductance in series with the resonator is used.
5. An oscillator as claimed in claim 1, wherein the active component is a field effect transistor.

* * * * *